US008824221B2

United States Patent
Cho et al.

(10) Patent No.: US 8,824,221 B2
(45) Date of Patent: Sep. 2, 2014

(54) HYBRID MEMORY DEVICE, SYSTEM INCLUDING THE SAME, AND METHOD OF READING AND WRITING DATA IN THE HYBRID MEMORY DEVICE

(75) Inventors: Geun-Hee Cho, Hwaseong-si (KR); Duc Nguyen, Charenton-le-pont (FR); Dong-Hwi Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 84 days.

(21) Appl. No.: 13/616,398

(22) Filed: Sep. 14, 2012

(65) Prior Publication Data
US 2013/0077382 A1    Mar. 28, 2013

(30) Foreign Application Priority Data
Sep. 26, 2011    (KR) .................. 10-2011-0097186

(51) Int. Cl.
G11C 7/00 (2006.01)
G11C 11/00 (2006.01)
G11C 5/04 (2006.01)
G11C 7/10 (2006.01)
G11C 14/00 (2006.01)

(52) U.S. Cl.
CPC ............. *G11C 11/005* (2013.01); *G11C 5/04* (2013.01); *G11C 7/10* (2013.01); *G11C 14/0018* (2013.01)
USPC ............... 365/189.2; 365/185.08; 365/185.23

(58) Field of Classification Search
CPC .......... G11C 11/005; G11C 5/04; G11C 7/10; G11C 14/0018
USPC .......... 365/148, 163, 189.02, 185.08, 185.23, 365/51, 63, 189.2
See application file for complete search history.

(56) References Cited

U.S. PATENT DOCUMENTS

| 7,107,407 | B2 | 9/2006 | Kato et al. | |
|---|---|---|---|---|
| 7,606,970 | B2 | 10/2009 | Lee | |
| 8,427,891 | B2* | 4/2013 | Best ........................... | 365/189.2 |
| 2010/0110748 | A1* | 5/2010 | Best ............................... | 365/51 |
| 2010/0318727 | A1 | 12/2010 | Lee et al. | |
| 2013/0308383 | A1* | 11/2013 | Best ......................... | 365/185.08 |

FOREIGN PATENT DOCUMENTS

| JP | 2004-152277 A | 5/2004 |
|---|---|---|
| JP | 2007-034431 A | 2/2007 |
| JP | 2007-200537 A | 8/2007 |
| JP | 2010-176305 A | 8/2010 |
| JP | 2010-198368 A | 9/2010 |
| KR | 10-0699893 B1 | 3/2007 |
| KR | 10-2010-0133710 A | 12/2010 |

* cited by examiner

*Primary Examiner* — Gene Auduong
(74) *Attorney, Agent, or Firm* — Sughrue Mion, PLLC

(57) ABSTRACT

A hybrid memory device is provided. The hybrid memory device includes a DRAM, a non-volatile memory and a control circuit. The control circuit selects one of output data of the DRAM and output data of the non-volatile memory according to a mode selecting signal and output the selected data. The control circuit outputs data requested to be output from the DRAM when the data requested to be output is in the DRAM, and may output the data requested to be output from the non-volatile memory when the data requested to be output is in the non-volatile memory. Accordingly, the hybrid memory device has a high speed in a read and write operation, and has low power consumption.

18 Claims, 11 Drawing Sheets

HYBRID MEMORY DEVICE, SYSTEM INCLUDING THE SAME, AND METHOD OF READING AND WRITING DATA IN THE HYBRID MEMORY DEVICE

CROSS-REFERENCE TO RELATED APPLICATION

This application claims priority under 35 U.S.C. §119 from Korean Patent Application No. 10-2011-0097186 filed on Sep. 26, 2011, in the Korean Intellectual Property Office, the entire contents of which are incorporated by reference.

BACKGROUND

1. Field

Devices, apparatuses, and systems consistent with embodiments relate to a hybrid memory device and a computer system including the hybrid memory device.

2. Description of Related Art

Recently, memory devices have been developed in a multi-chip package form in which volatile memory devices and non-volatile memory devices are included in one package.

SUMMARY

One of more embodiments provide a hybrid memory device that operates at a high speed in a read and write mode and has a small package.

One or more embodiments also provide a computer system including the hybrid memory device.

One or more embodiments also provide a method of reading and writing data in the hybrid memory device.

The technical objectives of the inventive concept are not limited to the above disclosure; other objectives may become apparent to those of ordinary skill in the art based on the following descriptions.

According to an aspect of exemplary embodiment, there is provided a hybrid memory device including a Dynamic Random Access Memory (DRAM), a non-volatile memory and a control circuit.

The control circuit may select one of output data of the DRAM and output data of the non-volatile memory according to a mode selecting signal and output the selected data. The control circuit may output data requested to be output from the DRAM when the data requested to be output is in the DRAM, and may output the data requested to be output from the non-volatile memory when the data requested to be output is in the non-volatile memory.

When output data of the non-volatile memory is output, the control circuit may output the output data of the non-volatile memory directly to an exterior of the hybrid memory device without storing the output data in the DRAM.

The control circuit may generate the mode selecting signal based on the output data of the DRAM and the output data of the non-volatile memory.

The control circuit may generate the mode selecting signal based on values of an address table.

The hybrid memory device may unconditionally store the data requested to be written to the DRAM.

The hybrid memory device may store the write-requested data in the DRAM after writing back a part of the data in the DRAM to the non-volatile memory, when a write request is received from a host and a space in which requested data is written is insufficient.

Data which has not been used for a longest time among data in the DRAM may be written back to the non-volatile memory.

The control circuit may include a mode selecting circuit and a multiplexer.

The mode selecting circuit may generate the mode selecting signal based on the output data of the DRAM and the output data of the non-volatile memory. The multiplexer may select one of output data of the DRAM and the output data of the non-volatile memory in response to the mode selecting signal.

The control circuit may include a mode selecting circuit and a multiplexer.

The mode selecting circuit may generate the mode selecting signal based on values of an address table. The multiplexer may select one of the output data of the DRAM and the output data of the non-volatile memory in response to the mode selecting signal.

The control circuit may further include an address buffer configured to determine the values of the address table based on an address received from a host.

The non-volatile memory may include a Phase-change Random Access Memory (PRAM) or a Resistive Random Access Memory (RRAM).

The hybrid memory device may include a memory module implemented in a form of a multi-chip package (MCP).

The hybrid memory device may include a stacked memory device, wherein the DRAM and the non-volatile memory are stacked three-dimensionally.

The DRAM and the non-volatile memory may be electrically connected by a through-silicon-via (TSV).

The DRAM, the non-volatile memory and the control circuit may be separate semiconductor chips.

According to an aspect of another exemplary embodiment, there is provided a system including a host and a hybrid memory device including a control circuit. The control circuit may select one of output data of the DRAM and output data of the non-volatile memory according to a mode selecting signal and output the selected data. The control circuit may output data requested to be output from the DRAM when the data requested to be output is in the DRAM, and may output the data requested to be output from the non-volatile memory when the data requested to be output is in the non-volatile memory.

The host may provide a command, an address and a clock signal to the hybrid memory device.

The command and the address may be a packet data in which the command and the address are combined together in a packet form.

According to an aspect of another exemplary embodiment, there is provided a method of reading data in a hybrid memory device, the method including receiving a data-read request from a host, determining whether a read-requested data is in a DRAM, reading data from a region of the DRAM corresponding to an address received from the host when the data requested to be output is in the DRAM, reading data from a region of a non-volatile memory corresponding to an address received from the host when the data requested to be output is not in the DRAM, outputting the read data directly to an exterior of the hybrid memory device without storing the read data in the DRAM, and transmitting the read data to the host.

According to an aspect of another exemplary embodiment, there is provided a method of writing data in a hybrid memory device, the method including receiving a data-write request from a host, determining whether a DRAM has a space to store a write-requested data, writing data into a region of the DRAM corresponding to an address received from the host when a space to store the write-requested data is in the DRAM, writing back a part of the data in the DRAM to a non-volatile memory, when a space to store the write-requested data is not in the DRAM, and writing data into a region of the DRAM corresponding to an address received from the host when a space to store the write-requested data is in the DRAM.

The method of writing data in a hybrid memory device may include writing back data which has not been used for a longest time among data in the DRAM into the non-volatile memory.

BRIEF DESCRIPTION OF THE DRAWINGS

The foregoing and other aspects will be apparent from the more particular description of exemplary embodiments with reference to the accompanying drawings in which.

DETAILED DESCRIPTION

Figure 1:
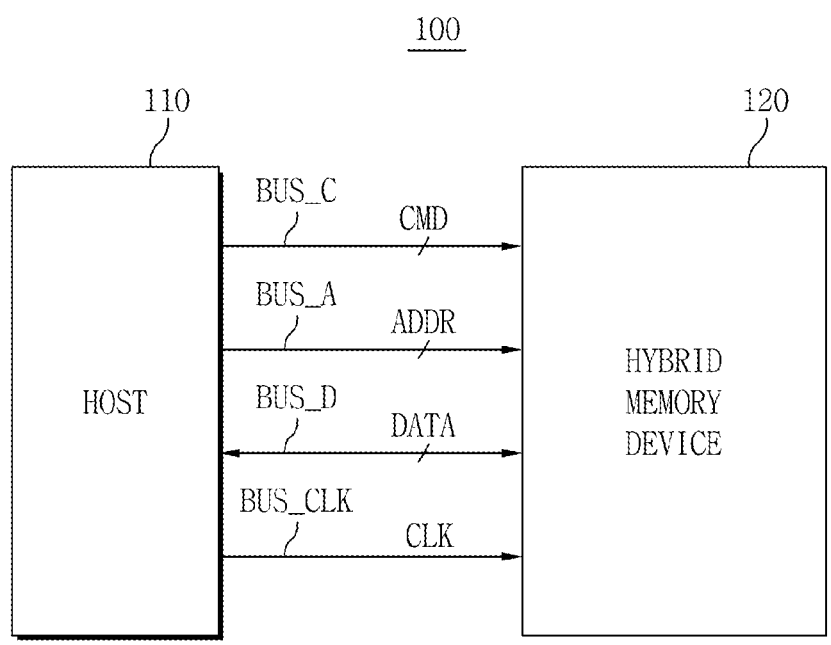
FIG. 1 is a block diagram illustrating a system including a hybrid memory device in accordance with an exemplary embodiment.

Various exemplary embodiments will now be described more fully with reference to the accompanying drawings in which some exemplary embodiments are shown. These inventive concepts may, however, be embodied in different forms and should not be construed as limited to the exemplary embodiments set forth herein. Rather, these exemplary embodiments are provided so that this disclosure is thorough and complete and fully conveys the inventive concept to those skilled in the art.

The drawings are not necessarily to scale, and the sizes and relative sizes of layers and regions may be exaggerated for clarity. In the drawings, like reference characters refer to the same parts throughout the different views.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the figures. For example, two operations shown in succession may in fact be executed substantially concurrently or may sometimes be executed in the reverse order, depending upon the functionality/acts involved.

Exemplary embodiments will now be described with reference to the accompanying drawings.

FIG. 1 is a block diagram illustrating a system including a hybrid memory device in accordance with an exemplary embodiment.

Referring to FIG. 1, the system 100 includes a host 110 and a hybrid memory device 120.

The host 110 generates a command CMD, an address ADDR, data DATA and a clock signal CLK. The hybrid memory device 120 receives the command CMD, the address ADDR, the data DATA and the clock signal CLK from the host 110 through a command bus BUS_C, an address bus BUS_A, a data bus BUS_D, and a clock bus BUS_CLK, respectively. The hybrid memory device 120 writes data into a memory space corresponding to the address ADDR, or reads data from a memory space corresponding to the address ADDR to transmit the read data to the host 110. The host 110 may be, for example, a central processing unit (CPU). The hybrid memory device 120 may include a dynamic random access memory (DRAM), and a non-volatile memory (NVM), and a control circuit that selects one of output data of the DRAM and output data of the NVM and outputs the selected data.

Figure 2:
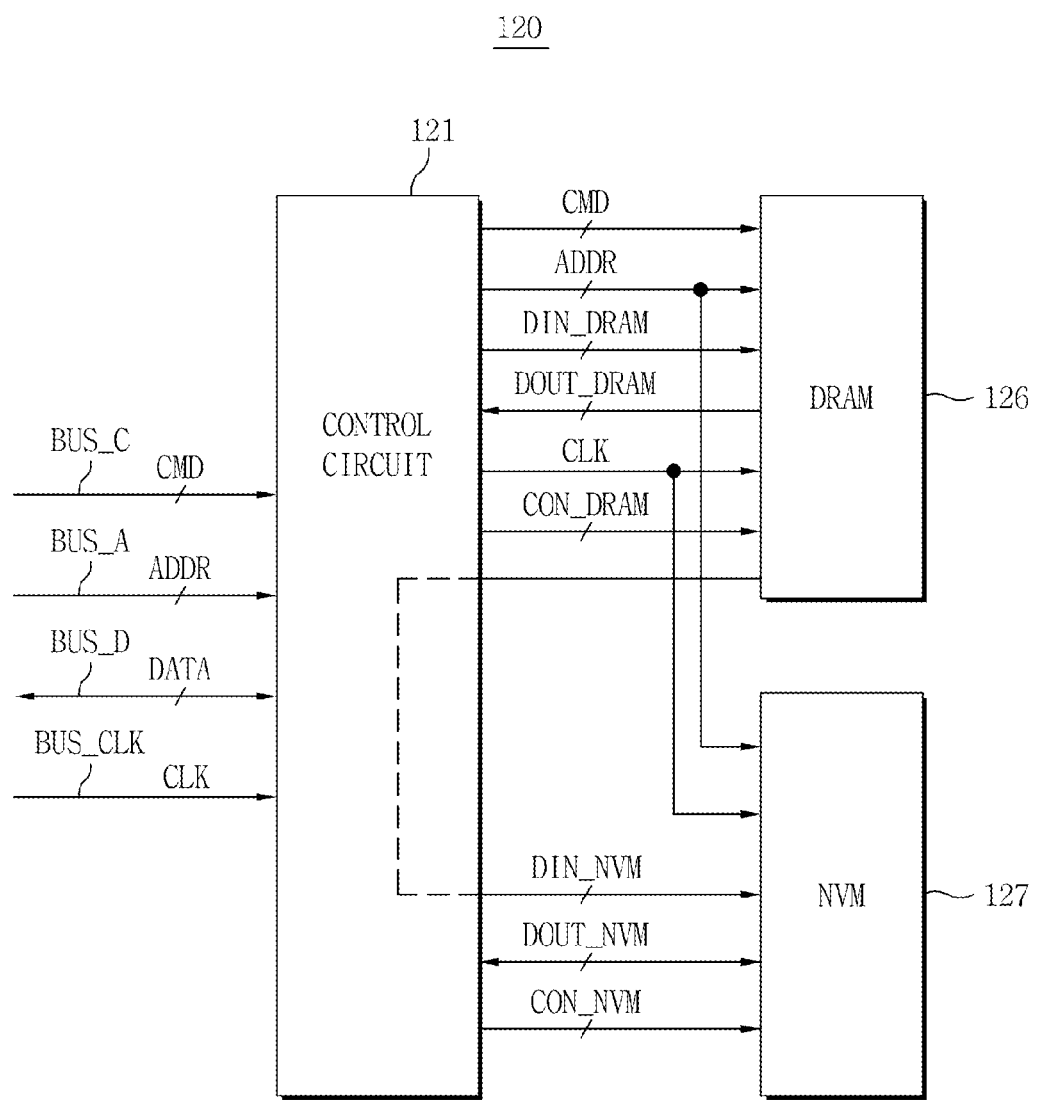
FIG. 2 is a block diagram illustrating an exemplary embodiment of the hybrid memory device included in the system of FIG. 1.

FIG. 2 is a block diagram illustrating an exemplary embodiment of the hybrid memory device included in the system of FIG. 1.

Referring to FIG. 2, the hybrid memory device 120 may include a control circuit 121, a DRAM 126 and an NVM 127. The control circuit 121, the DRAM 126 and the NVM 127 may be separate semiconductor chips, and may be a multi-chip package (MCP). The DRAM 126 may be a volatile memory and the NVM 127 may be a non-volatile memory. The control circuit 121 may be an application-specific integrated circuit (ASIC) chip. The control circuit 121 may be electrically connected to the DRAM 126 by a CMD bus, an ADDR bus, an DIN_DRAM bus, a DOUT_DRAM bus, a CLK signal, and a CON_DRAM signal, and electrically connected to the NVM 127 by a DIN_NVM bus, a DOUT_NVM bus, and a CON_NVM bus.

The control circuit 121 may select one of output data DOUT_DRAM of the DRAM and output data DOUT_NVM of the non-volatile memory and output the selected data in a read mode. When the output data DOUT_NVM from the NVM 127 is output, the output data DOUT_NVM is not stored in the DRAM but directly output to an exterior of the hybrid memory device. The control circuit 121 may receive the command CMD, the address ADDR, the data DATA and the clock signal CLK from the host 110 through the command bus BUS_C, the address bus BUS_A, the data bus BUS_D, and the clock bus BUS_CLK, and provide the command CMD, the address ADDR, the data DATA and the clock signal CLK to the DRAM 126. Further, the control circuit 121 may provide the address ADDR and the clock signal CLK to the NVM 127, and output the output data DOUT_NVM of the NVM 127 to the host 110 of FIG. 1. Further, the control circuit 121 may write-back a part of the data stored in the DRAM 126 to the NVM 126 when a storage space of the DRAM 126 is insufficient.

Figure 3:
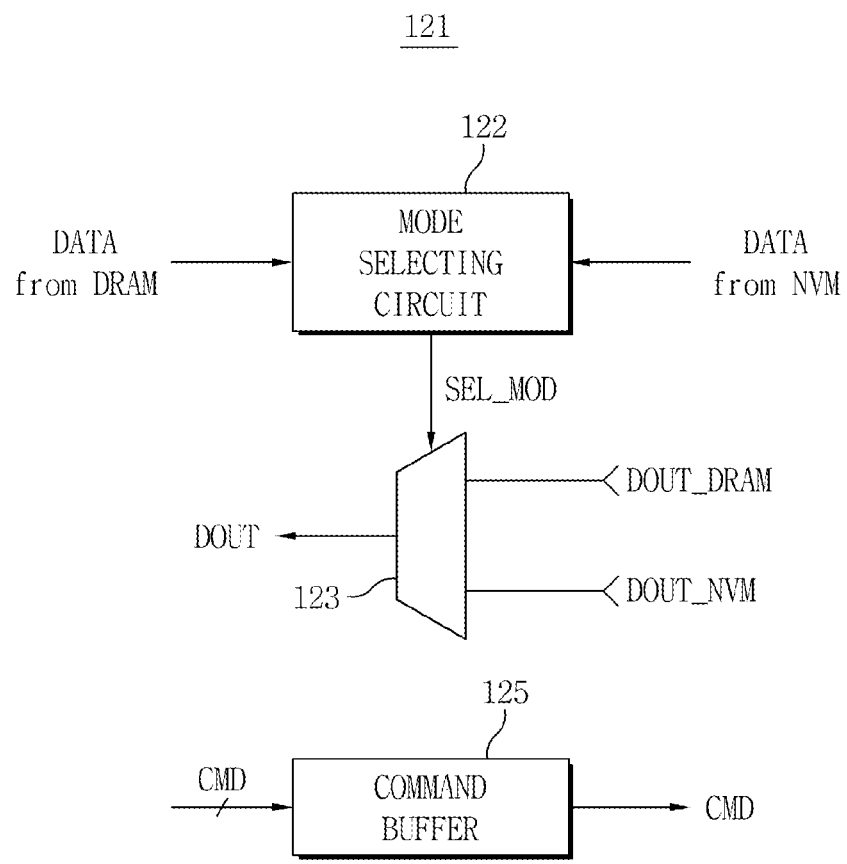
FIG. 3 is a circuit diagram illustrating an exemplary embodiment of a control circuit included in the hybrid memory device of FIG. 2.

FIG. 3 is a circuit diagram illustrating an exemplary embodiment of a control circuit included in the hybrid memory device of FIG. 2.

Referring to FIG. 3, the control circuit 121 may include a mode selecting circuit 122 and a multiplexer 123.

The mode selecting circuit 122 may generate the mode selecting signal SEL_MOD based on the output data of the DRAM 126 and the output data of the non-volatile memory 127. The multiplexer 123 may select one of the output data of the DRAM 126 and the output data of the non-volatile memory 127 in response to the mode selecting signal SEL_MOD.

Further, the control circuit 121 may further include a command buffer 125 that buffers and outputs the command CMD.

Figure 4:
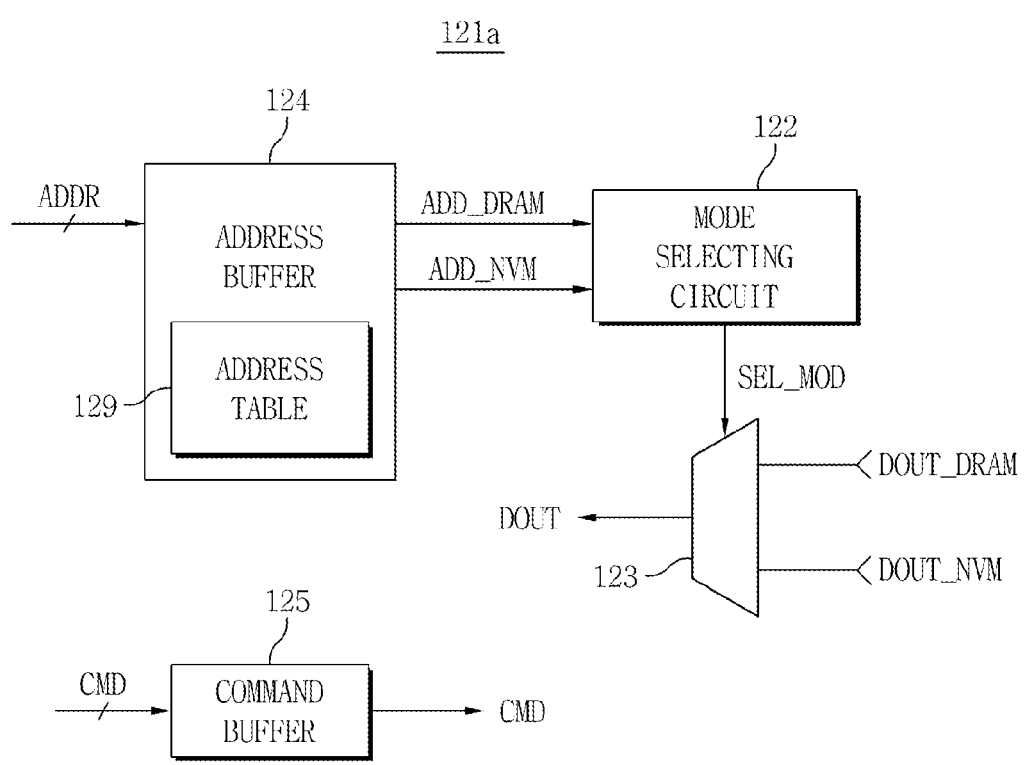
FIG. 4 is a circuit diagram illustrating another exemplary embodiment of a control circuit included in the hybrid memory device of FIG. 2.

FIG. 4 is a circuit diagram illustrating another exemplary embodiment of a control circuit 121a included in the hybrid memory device 100 of FIG. 2.

Referring to FIG. 4, the control circuit 121a may include a mode selecting circuit 122, a multiplexer 123 and an address buffer 124.

The address buffer 124 may include an address table 129, and determine values of the address table 129 based on the address ADDR received from the host 110. For example, the address buffer 124 may determine an address ADD_DRAM of a region of the DRAM 126 to which data is output and an address ADD_NVM of a region of the NVM 127 to which data is output.

The mode selecting circuit 122 may generate the mode selecting signal SEL_MOD based on the values ADD_DRAM and ADD_NVM of the address table 129. The multiplexer 123 may select one of the output data of the DRAM 126 and the output data of the non-volatile memory 127 in response to the mode selecting signal SEL_MOD.

Further, the control circuit 121a may further include a command buffer 125 that buffers and outputs the command CMD.

Hereinafter, the operation of the system 100 that includes the hybrid memory device 120 shown in FIG. 1 will be described referring to FIG. 1 to FIG. 4.

The hybrid memory device 120 may include a control circuit 121, a DRAM 126 and an NVM 127.

The control circuit 121 may select one of output data of the DRAM 126 and output data of the NVM 127 and output the selected data in a read mode. When the output data from the NVM 127 is output, the control circuit 121 does not store the output data of the NVM 127 in the DRAM but directly outputs the output data to an exterior of the hybrid memory device 120.

The control circuit 121 may generate the mode selecting signal SEL_MOD based on the output data of the DRAM 126 and the output data of the non-volatile memory 127, and may select one of the output data of the DRAM 126 and the output data of the non-volatile memory 127 in response to the mode selecting signal SEL_MOD.

Further, the control circuit 121a may generate the mode selecting signal SEL_MOD based on the values ADD_DRAM and ADD_NVM of the address table 129, and may select one of the output data of the DRAM 126 and the output data of the non-volatile memory 127 in response to the mode selecting signal SEL_MOD.

Further, the control circuit 121 may output data requested to be output from the DRAM 126 when the data requested to be output is in the DRAM 126, and may output the data requested to be output from the NVM 127 when the data requested to be output is not in the DRAM 126.

In an exemplary embodiment, the hybrid memory 120 may unconditionally store the data requested to be written to the DRAM 126 in a write mode.

Further, the hybrid memory 120 may store the write-requested data in the DRAM 126 after writing back a part of the data in the DRAM 126 to the NVM 127, when a write request is received from the host 110 and a space in which requested data is written is insufficient.

Further, the hybrid memory 120 may write back the data which has not been used for a longest time among data in the DRAM 126 to the NVM 127.

Figure 5:
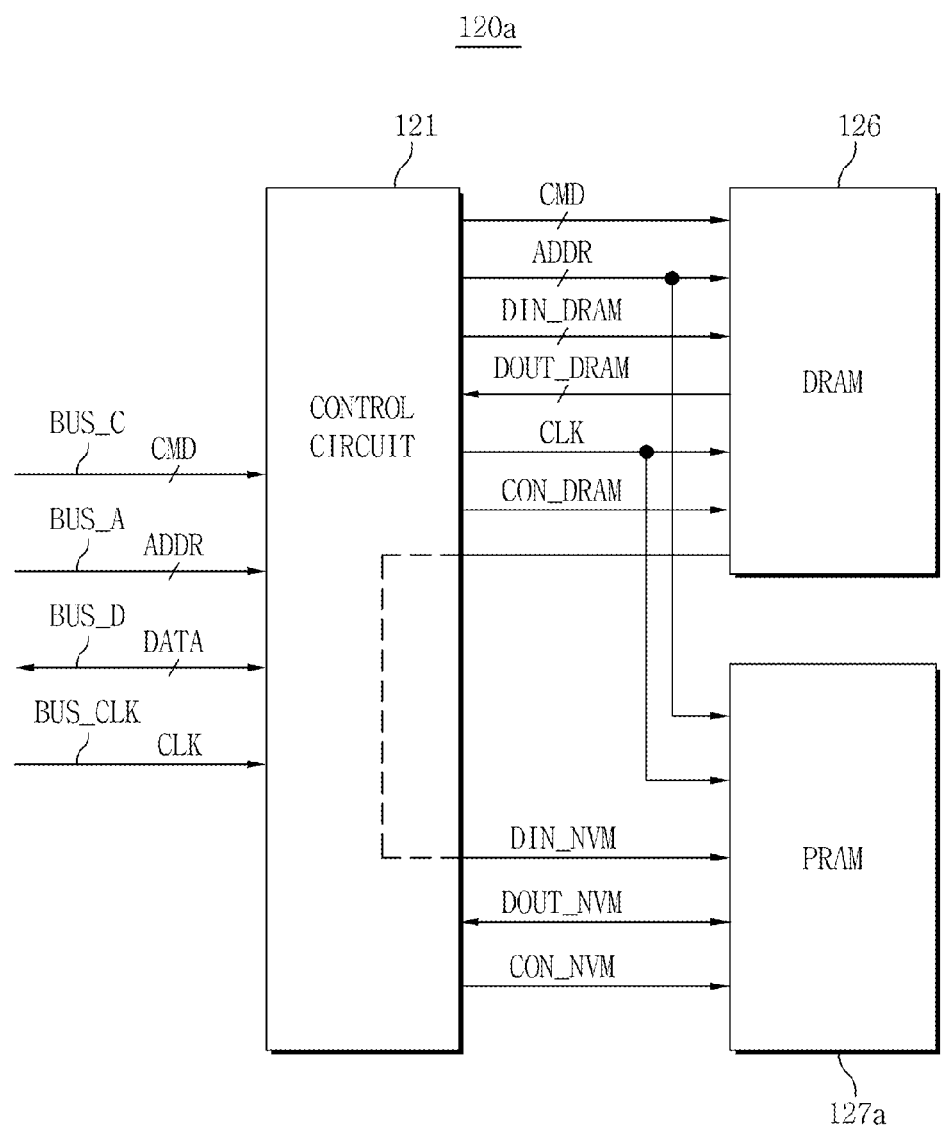
FIG. 5 is a block diagram illustrating another exemplary embodiment of the hybrid memory device included in the system of FIG. 1.

FIG. 5 is a block diagram illustrating another exemplary embodiment of the hybrid memory device 120 included in the system of FIG. 1.

Referring to FIG. 5, the hybrid memory device 120a may include a control circuit 121, a DRAM 126 and a (Phase-change RAM) PRAM 127a. The control circuit 121, the DRAM 126 and the PRAM 127a may be separate semiconductor chips, and may be a multi-chip package (MCP). The DRAM 126 may be a volatile memory and the PRAM 127a may be a resistive memory device that uses a phase-change material as a variable resistor. The PRAM 127a may be a non-volatile memory.

Figure 6:
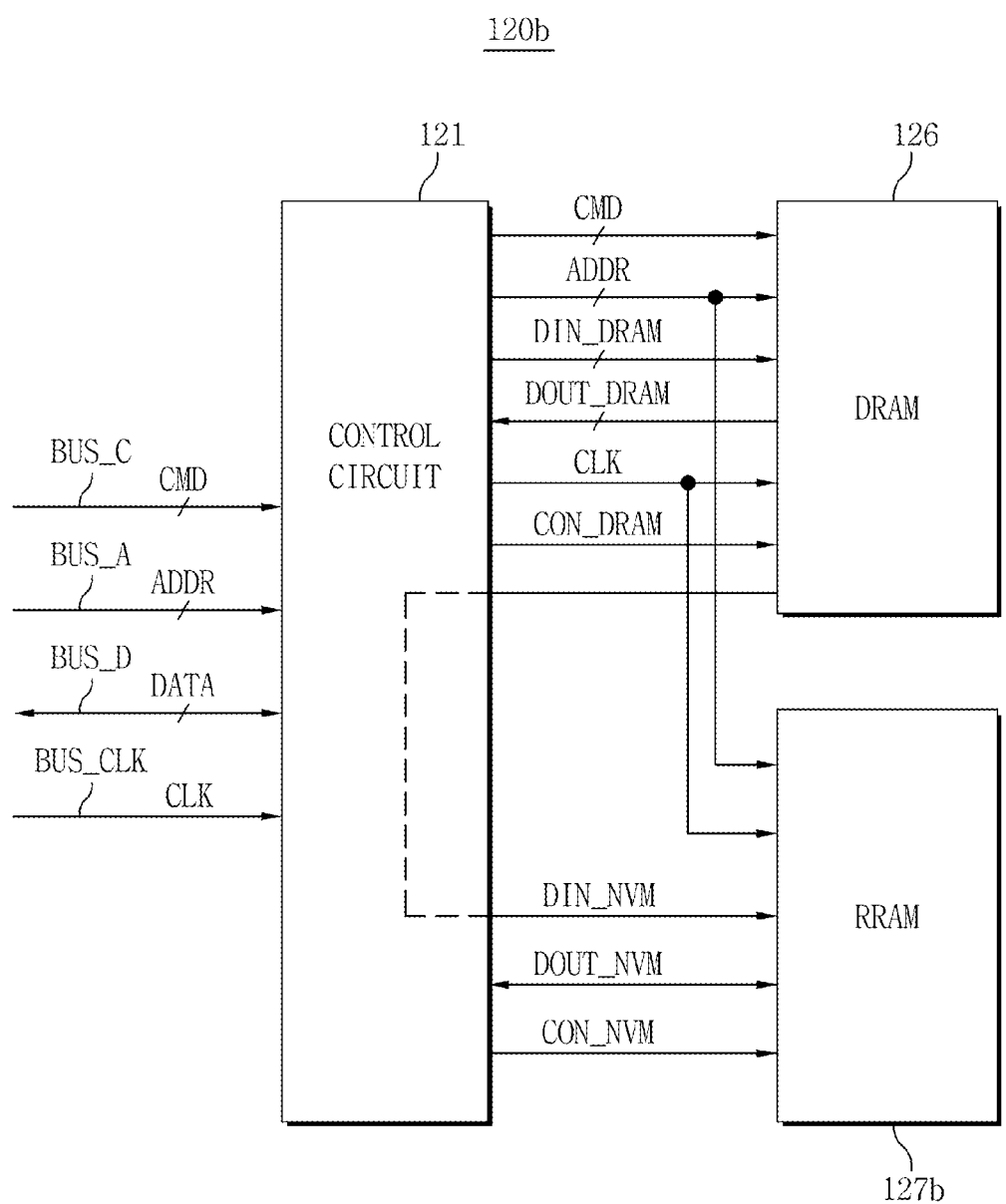
FIG. 6 is a block diagram illustrating still another exemplary embodiment of the hybrid memory device included in the system of FIG. 1.

FIG. 6 is a block diagram illustrating still another exemplary embodiment of the hybrid memory device 120 included in the system of FIG. 1

Referring to FIG. 6, the hybrid memory device 120b may include a control circuit 121, a DRAM 126 and a (Resistive RAM) RRAM 127b. The control circuit 121, the DRAM 126 and the RRAM 127b may be separate semiconductor chips, and may be a multi-chip package (MCP). The DRAM 126 may be a volatile memory and the RRAM 127b may be a resistive memory device that uses a transition metal oxide as a variable resistor. The RRAM 127b may be a non-volatile memory.

Figure 7:
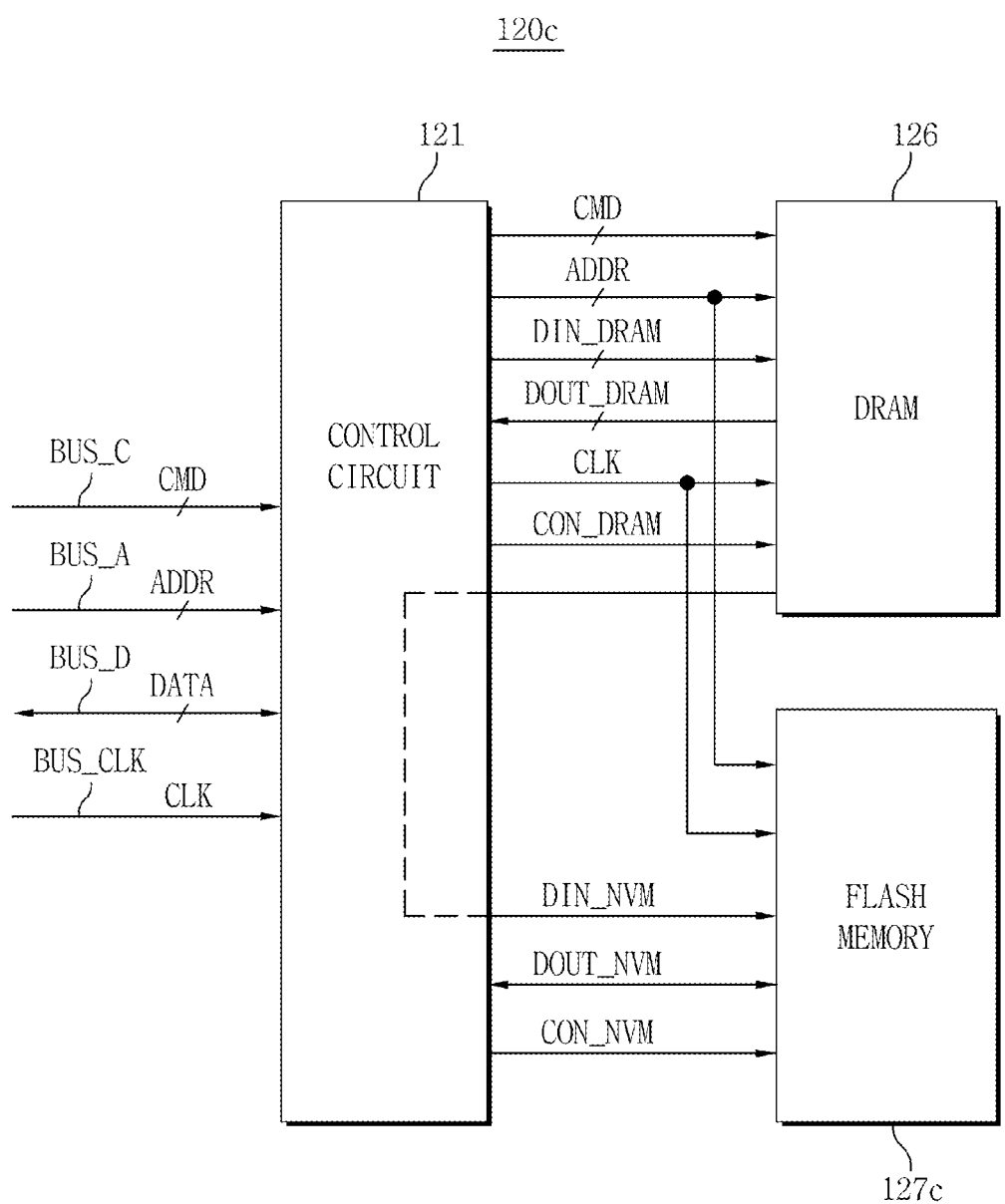
FIG. 7 is a block diagram illustrating yet another exemplary embodiment of the hybrid memory device included in the system of FIG. 1.

FIG. 7 is a block diagram illustrating yet another exemplary embodiment of the hybrid memory device 120 included in the system of FIG. 1.

Referring to FIG. 7, the hybrid memory device 120c may include a control circuit 121, a DRAM 126 and a flash memory 127c. The control circuit 121, the DRAM 126 and the flash memory 127c may be separate semiconductor chips, and may be a multi-chip package (MCP). The DRAM 126 may be a volatile memory and the flash memory 127c may be a kind of non-volatile memory device, and may have a floating gate and change a threshold voltage by adjusting a voltage applied to a control gate.

Figure 8:
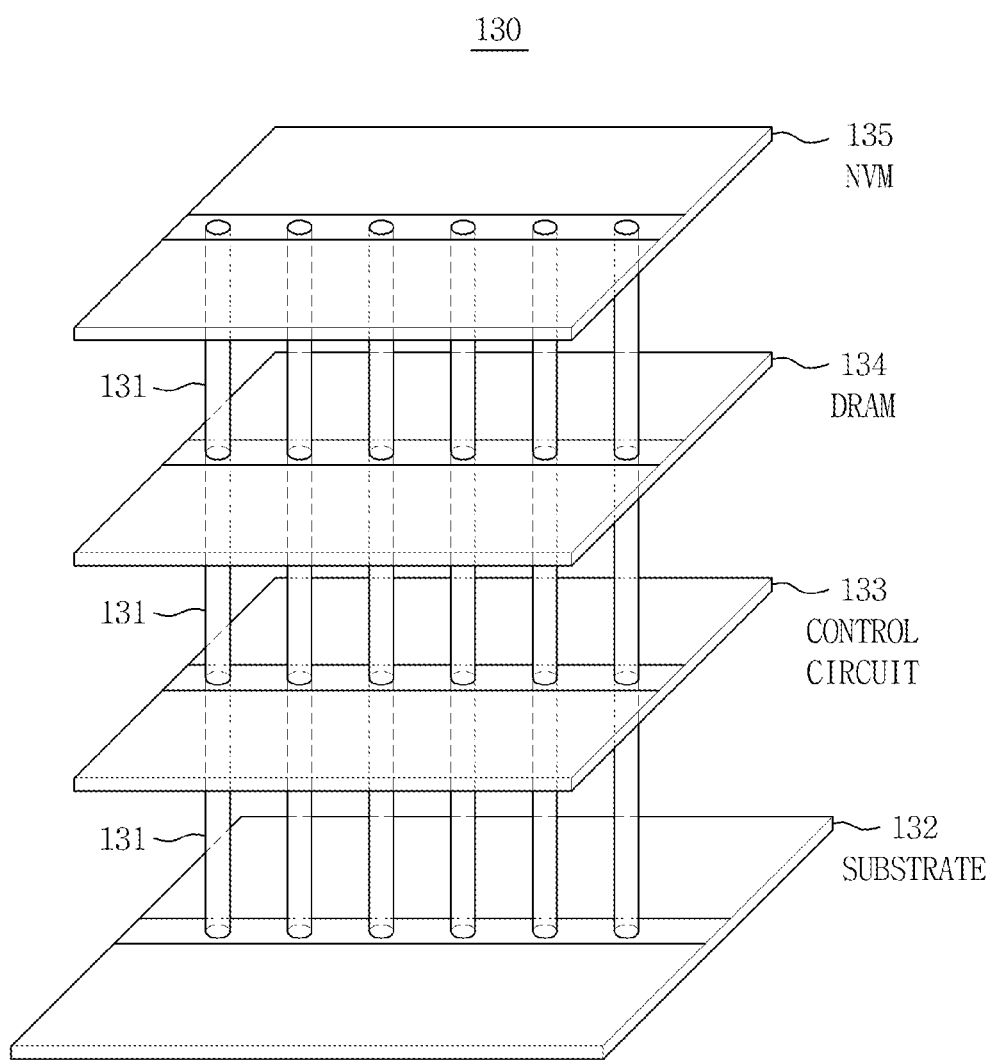
FIG. 8 is a block diagram illustrating yet another exemplary embodiment of the hybrid memory device included in the system of FIG. 1.

FIG. 8 is a block diagram illustrating yet another exemplary embodiment of the hybrid memory device 120 included in the system of FIG. 1.

Referring to FIG. 8, a hybrid memory device 130 may include a control circuit 133, a DRAM 134, an NVM 135 and a substrate 132.

The hybrid memory device 130 is a stacked memory device in which the control circuit 133, the DRAM 134 and the NVM 135 are three-dimensionally stacked on the substrate 132. Each of the layers (semiconductor chips) may be electrically connected through a plurality of through-silicon-vias (TSVs) 131 that are inter-layer connecting units.

As shown in FIG. 8, when semiconductor chips are three-dimensionally stacked, the area of the semiconductor device in a system may be decreased.

Figure 9:
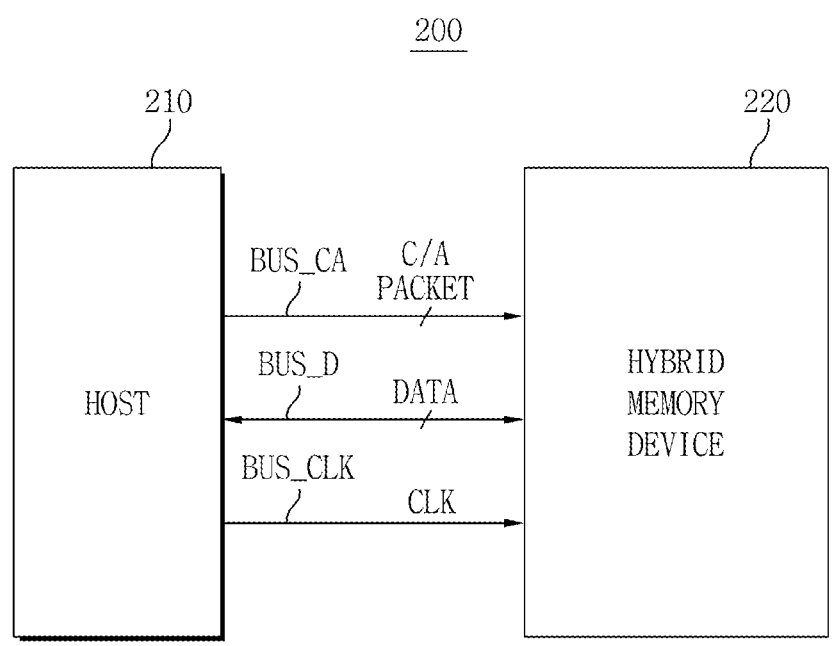
FIG. 9 is a block diagram illustrating a system including a hybrid memory device in accordance with another exemplary embodiment.

FIG. 9 is a block diagram illustrating a system 200 including a hybrid memory device in accordance with another exemplary embodiment.

Referring to FIG. 9, the system 200 includes a host 210 and a hybrid memory device 220.

The host 210 generates a command/address packet C/A PACKET in which a command CMD and an address ADDR are combined together, data DATA and a clock signal CLK. The hybrid memory device 220 receives the command/address packet C/A PACKET, the data DATA and the clock CLK from the host 210 through a command/address bus BUS_CA, a data bus BUS_D, and a clock bus BUS_CLK, respectively. The hybrid memory device 220 writes data into a memory space corresponding to the address ADDR, or reads data from a memory space corresponding to the address ADDR to transmit the read data to the host 210. The hybrid memory device 220 may include a control circuit 121, a DRAM 126 and an NVM 127 as shown in FIG. 2.

Figure 10:
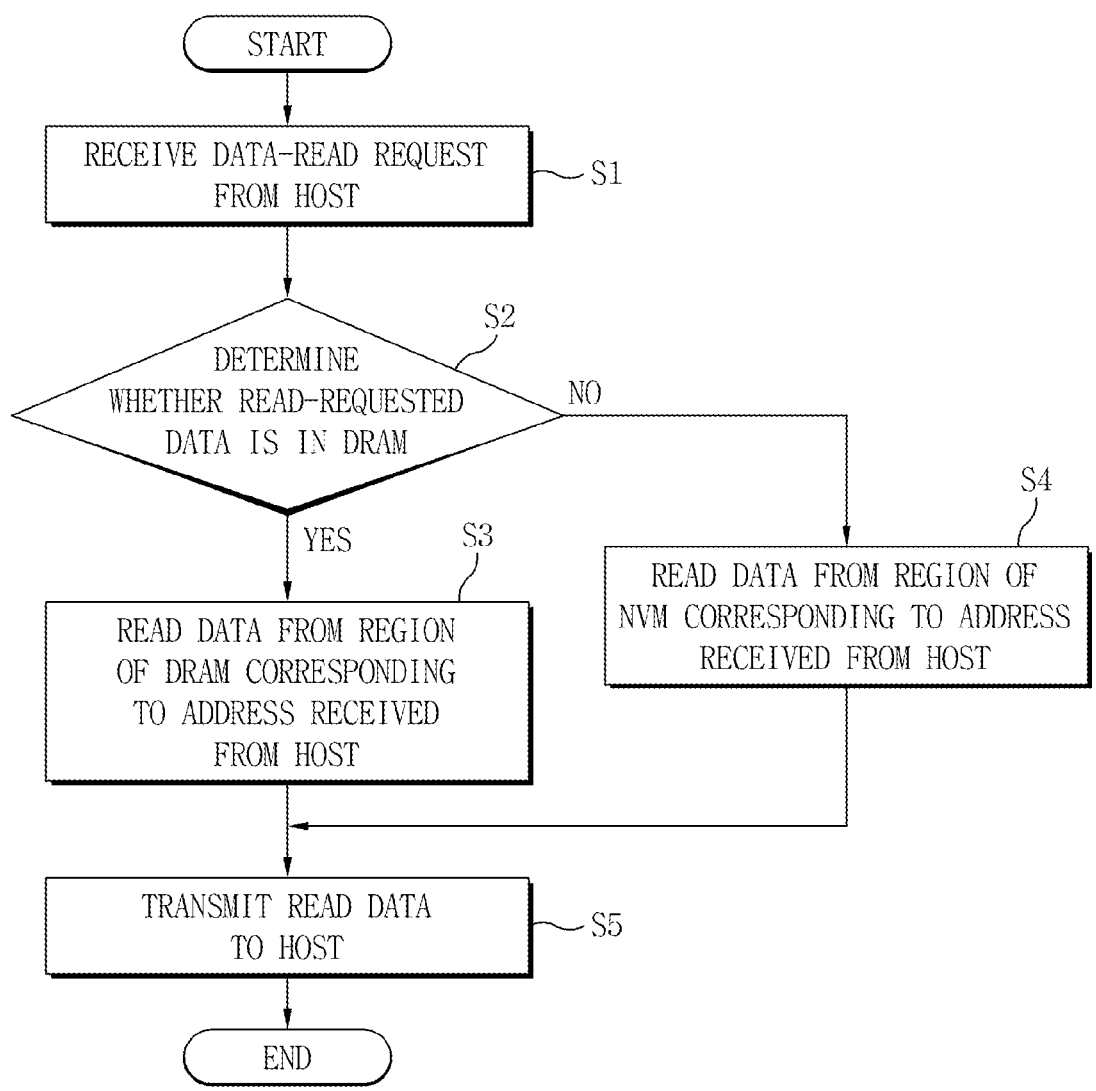
FIG. 10 is a flowchart illustrating a method of reading data in a hybrid memory device in accordance with an exemplary embodiment.

FIG. 10 is a flowchart illustrating a method of reading data in a hybrid memory device in accordance with an exemplary embodiment.

Referring to FIG. 10, a method of reading data in a hybrid memory device may include the following operations.

1) Receive a data-read request from a host (S1).
2) Determine whether read-requested data is in a DRAM (S2).
3) Read data from a region of the DRAM corresponding to an address received from the host when the data requested to be output is in the DRAM (S3).
4) Read data from a region of a non-volatile memory corresponding to an address received from the host when the data requested to be output is not in the DRAM (S4).
5) Transmit the read data to the host (S5).

Reading data from the NVM may include outputting the output data of the NVM to an exterior of the hybrid memory device without storing the output data of the NVM to the DRAM.

Figure 11:
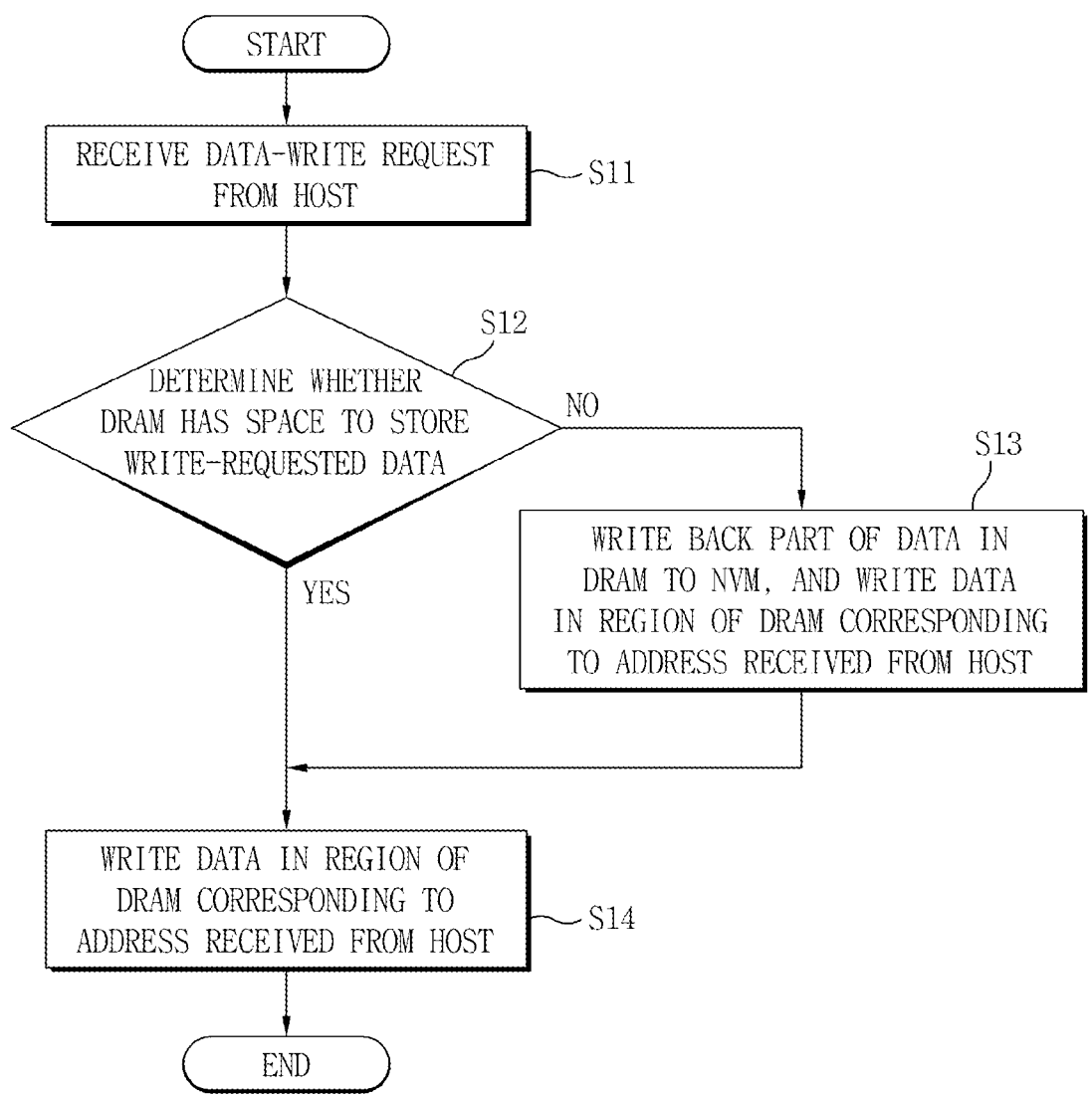
FIG. 11 is a flowchart illustrating a method of writing data in a hybrid memory device in accordance with an exemplary embodiment.

FIG. 11 is a flowchart illustrating a method of writing data in a hybrid memory device in accordance with an exemplary embodiment.

Referring to FIG. 11, a method of writing data in a hybrid memory device may include the following operations.

1) Receive a data-write request from a host (S11).
2) Determine whether a DRAM has space to store write-requested data (S12).
3) Write data in a region of the DRAM corresponding to an address received from the host when there is space to store the write-requested data in the DRAM (S14).
4) Write back a part of the data in the DRAM to a non-volatile memory, and write data in a region of the DRAM corresponding to an address received from the host, when there is insufficient space to store the write-requested data in the DRAM (S13).

The method of writing data in a hybrid memory device may include writing back data which has not been used for a longest time among data in the DRAM in the non-volatile memory.

Exemplary embodiments of the inventive concept may be applied to a memory device using a multi-chip package, and a computer system including the memory device.

The hybrid memory device in accordance with exemplary embodiments includes a DRAM, a non-volatile memory and a control circuit, and the control circuit selects one of output data of the DRAM and output data of the non-volatile memory and outputs the selected data. Further, the control circuit outputs the output data of the non-volatile memory directly to an exterior of the hybrid memory device without storing the output data in the DRAM.

Accordingly, the hybrid memory device in accordance with exemplary embodiments may have a high speed in a read and write operation, and have low power consumption.

The foregoing is illustrative of exemplary embodiments and is not to be construed as limiting thereof Although a few exemplary embodiments have been described, those skilled in the art will readily appreciate that many modifications are possible in exemplary embodiments without materially departing from the novel teachings and advantages. Accordingly, all such modifications are intended to be included in the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other embodiments, are intended to be included in the scope of the appended claims.

What is claimed is:

1. A hybrid memory device comprising:
a dynamic random access memory (DRAM);
a non-volatile memory; and
a control circuit configured to select one of output data of the DRAM and output data of the non-volatile memory according to a mode selecting signal and output the selected output data, configured to determine whether data requested to be output is in the DRAM, configured to output the data requested to be output from the DRAM in response to determining that the data requested to be output is in the DRAM, and configured to output the data requested to be output from the non-volatile memory in response to determining that the data requested to be output is not in the DRAM,
wherein the control circuit is configured to output the output data of the non-volatile memory directly to an exterior of the hybrid memory device without storing the output data of the non-volatile memory in the DRAM.

2. The hybrid memory device according to claim 1, wherein the control circuit is configured to generate the mode selecting signal based on the output data of the DRAM and the output data of the non-volatile memory.

3. The hybrid memory device according to claim 1, wherein the control circuit is configured to generate the mode selecting signal based on values of an address table.

4. The hybrid memory device according to claim 1, wherein, in a write mode, the hybrid memory device is configured to unconditionally store data requested to be written to the DRAM.

5. The hybrid memory device according to claim 1, wherein the hybrid memory device is configured to store write-requested data in the DRAM after writing back a part of the write-requested data in the DRAM to the non-volatile memory, when a write request is received from a host and space in which the write-requested data is written is insufficient.

6. The hybrid memory device according to claim 5, wherein data which has not been used for a longest time among data in the DRAM is written back to the non-volatile memory.

7. The hybrid memory device according to claim 1, wherein the control circuit comprises:
a mode selecting circuit configured to generate the mode selecting signal based on the output data of the DRAM and the output data of the non-volatile memory; and
a multiplexer configured to select one of the output data of the DRAM and the output data of the non-volatile memory in response to the mode selecting signal.

8. The hybrid memory device according to claim 1, wherein the control circuit comprises:
a mode selecting circuit configured to generate the mode selecting signal based on values of an address table; and
a multiplexer configured to select one of the output data of the DRAM and the output data of the non-volatile memory in response to the mode selecting signal.

9. The hybrid memory device according to claim 8, wherein the control circuit further comprises:
an address buffer configured to determine the values of the address table based on an address received from a host.

10. The hybrid memory device according to claim 1, wherein the non-volatile memory includes a phase-change random access memory (PRAM) or a resistive random access memory (RRAM).

11. The hybrid memory device according to claim 1, wherein the DRAM, the non-volatile memory and the control circuit are implemented in a form of a multi-chip package (MCP).

12. The hybrid memory device according to claim 1, wherein the DRAM and the non-volatile memory are stacked three-dimensionally.

13. The hybrid memory device according to claim 12, wherein the DRAM and the non-volatile memory are configured to be electrically connected by a through-silicon-via (TSV).

14. A system comprising:
a host; and
a hybrid memory device comprising a control circuit configured to select one of output data of a dynamic random access memory (DRAM) and output data of a non-volatile memory according to a mode selecting signal and output the selected data, configured to determine whether data that the host requests to be output is in the DRAM, configured to output the data that the host requests to be output from the DRAM in response to determining that the data requested to be output is in the DRAM, and configured to output the data that the host requests to be output from the non-volatile memory in response to determining that the data requested to be output is not in the DRAM.

15. A hybrid memory device comprising:
a dynamic random access memory (DRAM);
a non-volatile memory;
a multiplexer connected to the DRAM and the non-volatile memory, and configured to select and output data from the DRAM or data from the non-volatile memory in response to a selection signal; and
a mode selecting circuit that generates the selection signal based on the data of the DRAM and the data of the non-volatile memory, or based on an address,
wherein the hybrid memory device is configured to determine whether data requested to be output is in the DRAM, configured to output the data requested to be output from the DRAM in response to determining that the data requested to be output is in the DRAM, and configured to output the data requested to be output from the non-volatile memory in response to determining that the data requested to be output is not in the DRAM, wherein when the data from the non-volatile, memory is selected, the data from the non-volatile memory is output directly from the hybrid memory device without first being stored in the DRAM.

16. The hybrid memory device according to claim 15, wherein the hybrid memory device is a multi-chip package, and the DRAM is provided on a first chip, and the non-volatile memory is provided on a second chip which is different from the first chip.

17. The hybrid memory device according to claim 16, further comprising a substrate,
wherein the second chip is stacked on the first chip, and the first chip is stacked on the substrate.

18. The hybrid memory device according to claim 15, wherein the non-volatile memory is a phase-change random access memory (PRAM), a resistive random access memory (RRAM), or a flash memory.

* * * * *